United States Patent [19]
Deville

[11] Patent Number: 5,825,671
[45] Date of Patent: *Oct. 20, 1998

[54] SIGNAL-SOURCE CHARACTERIZATION SYSTEM

[75] Inventor: Yannick Deville, Villecresnes, France

[73] Assignee: U.S. Philips Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 394,976

[22] Filed: Feb. 27, 1995

[30] Foreign Application Priority Data

Mar. 16, 1994 [FR] France .................. 94 03078

[51] Int. Cl.$^6$ .................................. H04B 15/00
[52] U.S. Cl. .................. 364/574; 102/194; 364/572; 702/191; 381/94.3; 381/94.1; 381/71.1; 381/71.4
[58] Field of Search .................... 364/572, 574; 318/128; 381/71, 73.1, 94, 71.1, 71.2, 71.3, 71.4, 71.5, 71.6, 71.7, 71.8, 71.9, 71.11, 71.12, 71.13, 71.14, 94.1, 94.2, 94.3, 94.4, 94.5, 94.6, 94.7, 94.8, 94.9; 395/909, 917; 327/379

[56] References Cited

U.S. PATENT DOCUMENTS

| | | | |
|---|---|---|---|
| H417 | 1/1988 | Miles | 381/94 |
| 3,700,866 | 10/1972 | Taylor | 364/131 |
| 4,155,041 | 5/1979 | Burns et al. | 381/94 |
| 4,419,544 | 12/1983 | Adelman | 381/94 |
| 4,530,076 | 7/1985 | Dwyer | 364/574 |
| 4,625,829 | 12/1986 | Borth et al. | 381/94 |
| 4,630,304 | 12/1986 | Borth et al. | 381/94 |
| 4,630,305 | 12/1986 | Borth et al. | 381/94 |
| 4,754,486 | 6/1988 | Stafford et al. | 381/86 |
| 4,811,404 | 3/1989 | Vilmur et al. | 381/94 |
| 4,868,881 | 9/1989 | Zwicker et al. | 381/94 |
| 5,150,323 | 9/1992 | Castelaz | 364/807 |
| 5,208,786 | 5/1993 | Weinstein et al. | 367/124 |
| 5,299,148 | 3/1994 | Gardner et al. | 364/574 |
| 5,305,307 | 4/1994 | Chu | 381/71 |
| 5,321,759 | 6/1994 | Yuan | 381/71 |
| 5,419,198 | 5/1995 | Pla | 364/572 |
| 5,485,515 | 1/1996 | Allen et al. | 381/71 |
| 5,511,008 | 4/1996 | Flament et al. | 364/572 |
| 5,526,419 | 6/1996 | Allen et al. | 381/71 |
| 5,539,832 | 7/1996 | Weinstein et al. | 381/94 |

FOREIGN PATENT DOCUMENTS 9102324  2/1991  WIPO.

OTHER PUBLICATIONS

Jutten et al., "Blind Separation of Sources, Part I: An adaptive algorithm based on neuromimetic architecture", Signal Processing, 24 (1991), pp. 1–10.

Jutten et al., "New Algorithm for Separation of Sources", Congrès Satellite du Congrès Européen de Mathématiques, Paris (France) Jul. 2–3, 1991.

Primary Examiner—Eric W. Stamber
Attorney, Agent, or Firm—Edward W. Goodman

[57] ABSTRACT

A source characterization system (8) which, starting from linear convolutive mixtures E(t) of primary signals X(t) from sources (S1–Sn), determines signals F(t) which form an estimate of a characteristic variable of at least one primary signal X(t). This variable may be an average energy, a spectral density or an autocorrelation function. A preprocessing device (20) enables the signals E(t) from the mixtures to be pre-processed before they are applied to the source separation device (10). The measured variable may serve to retroact on the operation of the sources. The source characterization system may be used for the control of apparatuses for transmitting and/or receiving electric, acoustic or electromagnetic signals.

11 Claims, 2 Drawing Sheets

SIGNAL-SOURCE CHARACTERIZATION SYSTEM

BACKGROUND OF THE INVENTION

1. Field of the Invention

The invention relates to a source characterization system which, starting from first signals E(t) formed by linear convolutive mixing of primary signals X(t) from respective primary signal sources, supplies at least one second signal characterizing at least one respective primary signal X(t), the system comprising source separation means.

The invention also relates to the use of such a system for the control of apparatuses for transmitting and/or receiving electric, acoustic or electromagnetic signals. This may be, for example, a car radio or a hands-free telephone.

2. Description of the Related Art

The technique of separating primary signals from independent sources by processing mixtures of primary signals so as to separately extract each primary signal from these mixtures is known. This technique applies to primary signals which are only available in the form of said mixtures. This may concern general linear convolutive mixtures. The mixtures may have various origins. They may be produced by mechanisms of propagation of primary signals and/or by mechanisms of superposition of signals from a plurality of sources or by other causes.

In general, the separation technique is blind, i.e., the sources are assumed to be unknown and independent with unknown mixtures. For this purpose, a plurality of samples of these mixtures are detected, from these samples, one or a plurality of the original primary signals can be restored by means of separation algorithms.

Such a technique is known, for example, from the document "Blind separation of sources", C. JUTTEN, J. HERAULT, Signal processing 24 (1991), pages 1–10.

This document describes source separation means comprising a neuron network which receives at its input a plurality of components of signal mixtures E(t) and which restores the separate primary signals at its output. The neuron network operates recursively to calculate the synaptic coefficients by means of an adaptive algorithm. In this way, it is possible to process instantaneous linear convolutive mixtures, i.e., for which at any instant, each signal E(t) is a linear combination, with fixed or slowly varying real coefficients, of values of the primary signals X(t) at the same instant. The system adapts itself continuously to variations of the mixtures. Also known is the document "New algorithms for separation of sources" by C. JUTTEN and H. L. NGUYEN THI, Congrès Européen de Mathématiques, 2–3 Jul. 1991, PARIS (France), which relates to general linear convolutive mixtures. However, such a system has the drawback that the blind separation of all the primary sources of the mixture requires a substantial computing power. This may be a handicap for large-scale applications. Moreover, problems arise with the accuracy or stability of the separated sources at the output.

SUMMARY OF THE INVENTION

It is the object of the invention to reduce this computing power by taking into account the specific character of applications utilizing such a source separation.

This object is achieved with a source characterization system which comprises pre-processing means arranged before the source separation means, the preprocessing means pre-processing the signals E(t) by determining at least one characteristic variable of the signals E(t), this variable being supplied in the form of third signals I(t, p) formed by linear combinations, by fixed or slowly varying coefficients, of characteristic variables of the same nature related to the primary signals X(t).

By thus pre-processing the signals E(t), the source separation means are simplified considerably and only have to process linear combinations of characteristic variables of the primary signals, i.e., instantaneous convolutive linear mixtures. At the output, this does not yield the separated sources X(t) but one or more characteristic variables characterizing these sources. For many uses, it is in fact merely required to know these characteristic variables. If necessary, they may subsequently be processed to obtain the separated sources at the output.

This characteristic variable may be: an average energy, a spectral density, an autocorrelation function or other variables. This is very interesting, for example, if the output power of an apparatus, such as a car radio, should detect the voice of a user of a hands-free telephone to validate the processing of voice information.

Obviously, it is also possible to extend the system so as to supply either a plurality of signals F(t) for a plurality of characteristic variables for one and the same primary signal X(t), or a plurality of signals F(t) for an identical or non-identical characteristic variable relating to a plurality of primary signals X(t).

For some characteristic variables, such as a spectral density of a signal, pre-processing may be followed by post-processing to transform a computed characteristic variable into another characteristic variable. According to the invention, post-processing means are arranged at the output of the source separation means. By combining the pre-processing effected by the pre-processing means and the post-processing effected by the post-processing means, it is possible to determine spectral densities for one or a plurality of primary signals or other characteristic variables.

These and other aspects of the invention will be apparent from and elucidated with reference to the embodiments described hereinafter.

BRIEF DESCRIPTION OF THE DRAWINGS

The invention will be more fully understood with the aid of the following Figures, given by way of non-limitative examples, in which.

DESCRIPTION OF EMBODIMENTS

A distinction is made between several types of signals E(t) in accordance with the nature of the mixtures from which they originate. General convolutive linear mixtures produce generic signals $E_i(t)$ such that $$E_i(t) = \sum_j c_{ij}(t) * X_j(t) \qquad (1)$$

where $c_{ij}(t)$ are the impulse responses of the mixture filters, and where the symbol (*) represents a convolution product.

These general mixtures include a family of mixtures for which an arbitrary signal X(t) propagates with a fixed propagation delay θ and with a constant attenuation $1/\alpha_{ij}$. This corresponds, in particular, to the propagation of sound waves in free air.

The generic signals $E_i(t)$ are then of the type:

$$E_i(t) = \sum_j \alpha_{ij} X_j(t - \theta_{ij}) \qquad (2)$$

where $\theta_{ij}$ are constants defining a propagation delay and where the symbol (·) denotes a classical multiplication. These are linear convolutive mixtures with a fixed non-zero delay.

This family includes a sub-family of mixtures for which the propagation delay $\theta_{ij}$ is zero. The generic signals $E_i(t)$ are then of the type:

$$E_i(t) = \sum_j a_{ij} X_j(t) \qquad (3)$$

where $a_{ij}$ are fixed or slowly varying coefficients (which may differ from the coefficients $\alpha_{ij}$). These are linear instantaneous or linear convolutive mixtures with zero delay.

The cited document by C. JUTTEN and J. HERAULT relates to signals in accordance with equation (3). The invention also relates to signals of two other types.

Figure 1:
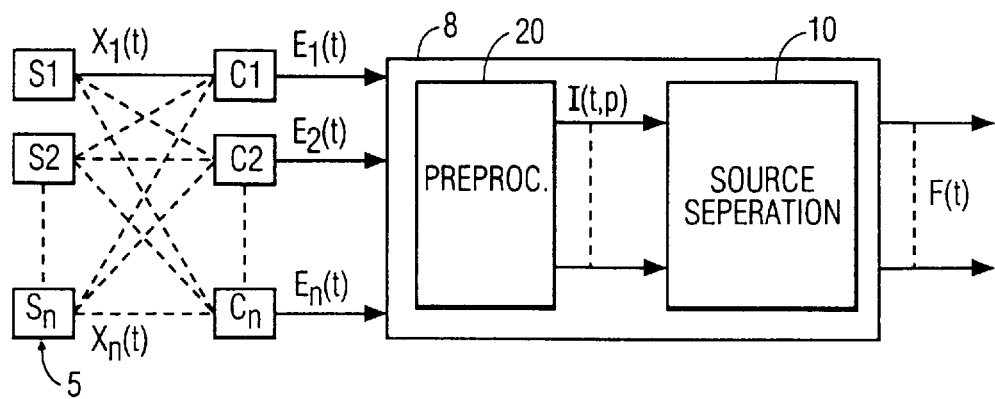
FIG. 1 is a block diagram of a source characterization system comprising pre-processing means.

By way of example, the case is considered that the volume of sound of a car radio mounted in a vehicle is to be controlled. The car radio comprises means (not shown) which can be influenced to control the volume of sound produced by the car radio depending on ambient sound sources. Thus, if the ambient noise increases (open windows, higher speed, driving noise . . . ) it may de desirable to increase the sound level produced by the car radio. This is not the case if the ambient sound sources are formed by the voices of passengers. The problem is then to reduce rather than increase the sound volume when the passengers talk. This requires identification of passenger voices. FIG. 1 shows primary sources 5, S1 to Sn, formed by, for example, the passengers voices, by various noise sources (engine, car body, air circulation through the windows etc.) and by the car radio itself. To identify the voices, transducers C1–Cn, for example, microphones, are placed inside the passenger space. A transducer may directly pick up the sound emitted by the loudspeaker. The microphones detect first signals $E_1(t)$ to $E_n(t)$ from mixtures of primary signals $X_1(t)$ to $X_n(t)$ supplied by the sources S1 to Sn.

The mixtures formed inside the passenger space may be regarded as being related directly to the propagation of sound signals in air. In a first approximation, these mixtures may be characterized by a non-zero attenuation coefficient and a non-zero propagation time constant characteristic of each source. The signals $E_i(t)$ detected by the microphones can be defined by the expression:

$$E_i(t) = \sum_{j=1}^{n} \alpha_{ij} X_j(t - \theta_{ij}) \qquad (4)$$

in which:
i is a current index of a microphone
j is a current index of a source $1/\alpha_{ij}$, $\theta_{ij}$ are attenuation coefficients and propagation time constants, respectively, characteristic of the propagation from the source $S_j$ to the microphone $E_i$.

In accordance with the invention, the signals $E_i(t)$ enter the source characterization system 8, which comprises pre-processing means 20 followed by source separation means 10.

Source separation means capable of separating instantaneous linear signal mixtures, i.e., mixtures for which the terms $\theta_{ij}$ are all zero (equation 3), are much simpler and therefore easier to realize than source separation means capable of separating non-zero linear convolutive mixtures in accordance with equation 2. The means for processing linear instantaneous mixtures can be those described in the cited document by C. JUTTEN and J. HERAULT.

In accordance with the invention, source separation means (10), capable of separating linear instantaneous signal mixtures is selected, which is preceded by pre-processing means 20, which converts the non-zero delay linear mixtures formed by the first signals $E_i(t)$ so as to obtain said linear combinations formed by the third signals $I_i(t, p)$. Here, t is the time and p is a significant parameter for the relevant characteristic variable (p is, for example, a frequency). The parameter p is not to be used if the characteristic variable is an average energy.

The structure of the pre-processing means 20 depends on the characteristic variable of the primary signals X(t) to be identified. This variable may be:

the average energy of a primary signal X(t) of one or more sources. In this case, it is an overall characteristic variable determined for a given duration, for successive time intervals, an autocorrelation function of a primary signal X(t) or a plurality of primary signals X(t), determined for a given duration, for one or more successive time intervals, a spectral density giving the spectral distribution of a primary signal X(t) or a plurality of primary signals X(t), determined for a given duration, for one or more successive time intervals.

One skilled in the art will be able to carry the invention into effect for other characteristic variables without departing from the scope of the invention.

To carry out the invention, the d.c. components of the signals E(t) are first removed, for example by low-pass filtering. This yields signals E(t) whose average value is zero, as in the document by C. JUTTEN and J. HERAULT.

There is a particular case for which there are two sources S1 and S2 and two mixed signals E1(t) and E2(t) among which one of them E1(t) is a mixture of sources signal and the other is a pure signal (or considered as such) coming directly from one of the sources. In that case, sources separation means 10 can be simplified into an adaptive filtering device realizing a substraction of the pure signal from the other signal after weighting adaptively the signals.

The case can be generalized to the one having a pure signal and a plurality of mixed signals containing the pure signal.

Practically, a pure signal can be measured in a car radio directly at the output of the car radio just before its transmission by the loudspeaker.

By way of example, the case will be considered in which the average energy of a primary signal X(t) is determined. For this purpose, the pre-processing means 20 computes the average signal energy $E_i(t)$. For the signal $E_1(t)$, this average energy is determined for a duration δ, starting from an instant $t=T_0$, such that:

$$\epsilon_{E1}(T_o, \delta) = \sum_{t=T_o}^{T_o+\delta} E_1^2(t) \quad (5)$$

In the case of two sources S1 and S2 with mixtures in accordance with equation (2), the signal measured by the transducer C1 may be written as:

$$E1(t)=\alpha_{11} \cdot X_1(t-\theta)+\alpha_{12}X_2(t-\theta_{12})$$

The average energy is:

$$\epsilon_{E1}(T_0,\delta) \cong \alpha_{11}^2 \cdot \epsilon_{X1}(T_0,\delta)+\alpha_{12}^2 \cdot \epsilon_{X2}(T_0,\delta),$$

in the case of non-correlated sources $X_1$ and $X_2$, and by selecting $\delta$ in such a manner that:

$$\theta_{11}, \theta_{12} << \delta..$$

It is found that the delay terms $\theta_{11}$, $\theta_{12}$ have disappeared and that the term $\epsilon_{E1}$ is a linear mixture of the average energies of the sources S1 and S2, with fixed or slowly varying coefficients and zero delay.

Calculation of the average energies of the signals $E_i(t)$ thus yields signals $I(t, p)=\epsilon_{Ei}(T_0,\delta)$ from which the energies of the primary signals can be extracted.

Figure 3:
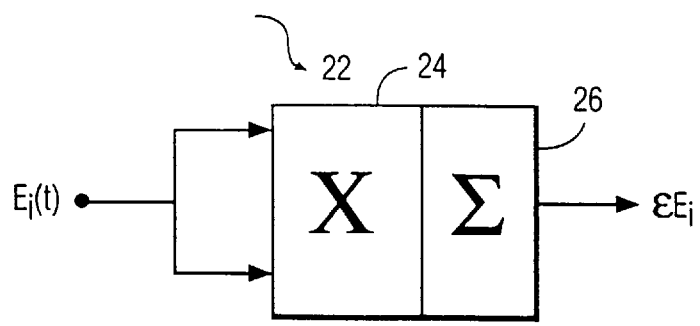
FIG. 3 is an example of a diagram of a part of the pre-processing means for determining the average energy of a signal.

FIG. 3 shows an element 22 forming part of the pre-processing means 20. This element 22 comprises means 24 for multiplying the signal $E_i(t)$ by itself, followed by means for storing the multiplication results for the duration $\delta$. At the output, this yields the average energy $\epsilon_{E1}$ corresponding to the signal $E_i(t)$.

The diagram in FIG. 3 represents a variant for digital signal processing. The same result as with an analog version can be obtained, for example, by integrating the rectified signal by means of capacitances, without thereby departing from the scope of the invention.

The pre-processing means 20 then comprises a plurality of elements 22, each being associated with a signal $E_i(t)$. It is possible to apply time multiplexing At the output, a plurality of average energies $\epsilon_{E1}$ is obtained, corresponding to each signal $E_i(t)$. All these average energies $\epsilon_{E1}$ are input into the source separation means 10 in a manner as shown in FIG. 1. This means effect source separation and supplies output signals $F_i(t)$ which, in the present case, are the average energies of each of the primary signals $X_i(t)$ in the successive time intervals considered.

Preferably, the source separation means 10 comprises a neuron network. This is, for example, a network as described in the cited document by C. JUTTEN and J. HERAULT. In accordance with the technique known to those skilled in the art, the operation of a neuron network comprises two phases:

a learning phase in which it learns to perform a task, and a resolution phase in which it uses the data thus learned to determine the results corresponding to current values.

These learning techniques are known and will not be explained here. It is adequate to know that they consist in applying samples to the input and modifying the characteristics of the neuron network (basically its synaptic coefficients) to produce, at its output, the envisaged results corresponding to the samples. Use is made of "unsupervised" learning, i.e., on the basis of the samples, an algorithm is applied to adapt the synaptic coefficients in such a manner that the outputs of the neuron network supply second signals F(t) which are independent of one another. Such a learning process is known to those skilled in the art.

With the configuration of synaptic coefficients thus determined, the neuron network is now used with new input data. It is thus capable of determining results depending on the new input data for the function it has learned to perform. In order to allow the system to effect a continuous characterization of sources by adapting itself to the continual variations of the mixtures, learning is effected iteratively so as to update the synaptic coefficients for the characterization of new mixtures.

Measured signals $E_i(t)$, which correspond to primary sources $X_i(t)$ with unknown characteristics, are applied to the input and the means 10 supplies measures of these unknown characteristics (in the present case average energies).

The characteristic properties of the primary signals X(t) to be measured are determined in successive time intervals of a duration $\delta$. In each time interval this may concern:

for the average energy, a single value, for determining the autocorrelation function, a series of values obtained by comparing a signal with itself at instants which are shifted by a time $\tau$, for determining spectral densities, a plurality of values determined at different frequencies.

Figure 4:
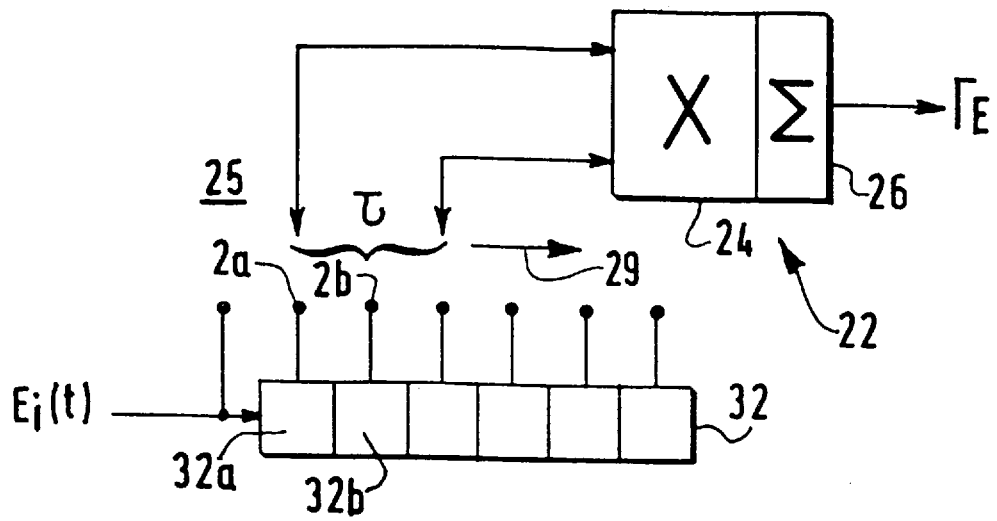
FIG. 4 is an example of a diagram of a part of the pre-processing means for determining autocorrelation functions.

By way of example, the case will be considered in which autocorrelation functions $\Gamma(\tau)$ are to be determined for primary signals $X_i(t)$ with $\Gamma_{Xi}(\tau)=\Sigma X_i(t) \cdot X_i(t+\tau)$. For this purpose, the pre-processing means 20 determines the autocorrelation functions of the signals $E_i(t)$ such that $\Gamma_{E_i}(\tau)=\Sigma E_i(t) \cdot E_i(t+\tau)$. The means 20 comprises pre-processing blocks 25 as shown in FIG. 4. The number of blocks 25 is equal to the number of signals E(t) to be processed. It is also possible to apply time multiplexing. To effect the correlation of a signal E(t) with itself, the signal E(t) is inputted into acquisition means 32, which takes successive samples of the signal E(t) at a given rate (duration D). This may be a memory comprising, inter alia, storage elements 32a, 32b in which a series of samples is stored. The shift $\tau$ is successively given the values D, 2D, 3D etc. The samples which appear, spaced by a time D, for example, on the output 2a, 2b of the storage elements 32a, 32b, are applied to the processing means 22 already described, in order to determine the values $E(t) \cdot E(t+D)$. By sliding addressing (arrow 29) of the memory, the value of the autocorrelation function $\Gamma_E$ is determined for the totality of the relevant signal E(t) corresponding to $\tau=D$. Other values of the autocorrelation function are computed likewise with sliding addressing for a shift 2D and so on for 3D, 4D . . . All of these autocorrelation values form the autocorrelation function.

It will be obvious to those skilled in the art that the acquisition means 32 may be given another structure than that shown in FIG. 4 without departing from the scope of the invention. At the output of the element 22, the autocorrelation function $\Gamma_E$ corresponding to the signal E(t) is obtained:

$$\Gamma_{E_1}(\tau)=\Sigma E_i(t) \cdot E_i(t+\tau)$$

The different signals E(t) in FIG. 1 are thus processed similarly to provide autocorrelation functions $\Gamma_E$ for each signal E(t). In that case, the signals I(t, p) in FIG. 1 are the autocorrelation functions $\Gamma_E$. By applying the same principles as already described for the average energies, the source separation means 10 learns, on the basis of examples, to compute autocorrelation functions $\Gamma_X$ corresponding to each of the sources.

When the example is limited to two sources S1 and S2, the following is valid:

$$E1(t)=\alpha_{11} \cdot X_1(t-\theta_{11})+\alpha_{12}X_2(t-\theta_{12})$$

$$E2(t)=\alpha_{21} \cdot X_1(t-\theta_{21})+\alpha_{22}X_2(t-\theta_{22})$$

yielding autocorrelation functions $\Gamma_{E1}$ and $\Gamma_{E2}$ such that:

$$\Gamma_{E1}(\tau)=\alpha_{11}^2 \cdot \Gamma_{X1}(\tau)+\alpha_{12}^2 \cdot \Gamma_{X2}(\tau)$$

$$\Gamma_{E2}(\tau)=\alpha_{21}^2 \cdot \Gamma_{X1}(\tau)+\alpha_{22}^2 \cdot \Gamma_{X2}(\tau)$$

The source separation means 10 derives the autocorrelation functions $\Gamma_X$ of the source signals such that:

$$\Gamma_X(\tau)=\Sigma X(t) \cdot X(t+\tau)$$

When the system 8 determines the autocorrelation functions of the primary signals X(t), it is also possible to derive the energies of these signals. For this purpose it suffices to select, in FIG. 4, a delay $\tau=0$, yielding at output the values of $\Gamma_X(0)$ which are equal to the energies.

This mode of operation is faster than the calculation of energies as set forth above, because it allows the source characterization system to effect learning in a single time interval and not in a series of time intervals. However, this requires more hardware.

In another example, the signals I(t, p) may be signals representing spectral densities. In that case the pre-processing means 20 computes the autocorrelation functions, subsequently effects a Fourier transform for each signal E(t) and supplies signals I(t, f), where f is the frequency, or it effects a Fourier transform (for example, a fast Fourier transform) and subsequently calculates the square of the modulus of the Fourier transform thus determined.

All of the signals I(t, f) derived from the signals E(t) and determined for the same frequency f are processes in the source separation means 10 as described hereinbefore. The signals F(t) at the output then represent the spectral densities $D_X$ corresponding to the sources S for the frequency f.

Successive operation at different frequencies f enables a spectral density function to be obtained for one or more sources by combining the spectral density values for one source at these different frequencies.

The output signals of the pre-processing means, which, as just described, may be average energies, autocorrelation functions, spectral densities or the like, can subsequently be used to influence on or more sources S1–Sn.

Thus, when, in the case of a car radio mounted in a car, the average energy of a source S1 has been determined, it is possible to control the output amplifier of the car radio depending on the measured average energies. Likewise, a detection of a source S2 formed by a voice of a passenger enables the volume of the car radio to be lowered, or the operation of a telephone to be controlled, for example, by transmitting numbers pronounced by a passenger or validating the transmission of speech only when speech is detected.

If the characteristic variable corresponds to spectral densities, it is possible to influence the tone control or the equalizer of the car radio.

What has just been stated obviously also remains valid in the case of other sound reproduction equipment associated with transducers or detectors for the signals E(t).

Figure 2:
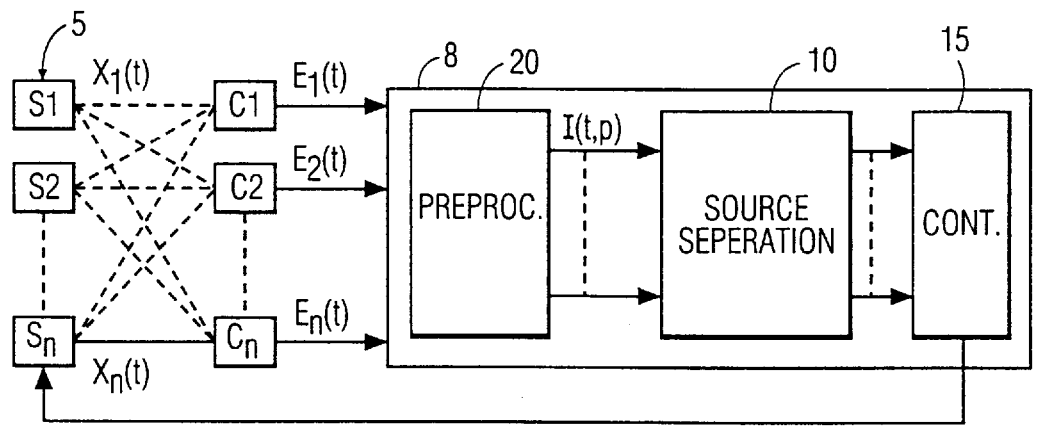
FIG. 2 shows a source characterization system comprising control means for retroacting on primary signal sources.

To carry out this control, the source characterization system 8 comprises control means 15 (FIG. 2), which determines the action to be taken in combination with the relevant application. Thus, detection of a voice in the passenger space of the car may result in the sound volume of the car radio being influenced. For this purpose, the control means 15 supplies a command 16, which influences the appropriate source.

For other applications, other sources S1–Sn may be involved, such as radio sources, the mixtures being brought about by radio transmission. In that case, the signals E(t) can be detected by detectors formed by, for example, aerials. The processing performed by the source characterization system is similar.

In still other cases, the sources are located inside the same apparatus, the signals X(t) being conveyed by means of wires and the mixtures being formed by cross-talk between the wires. The signals E(t) are then not obtained by means of the transducers C1 to Cn.

Figure 5:
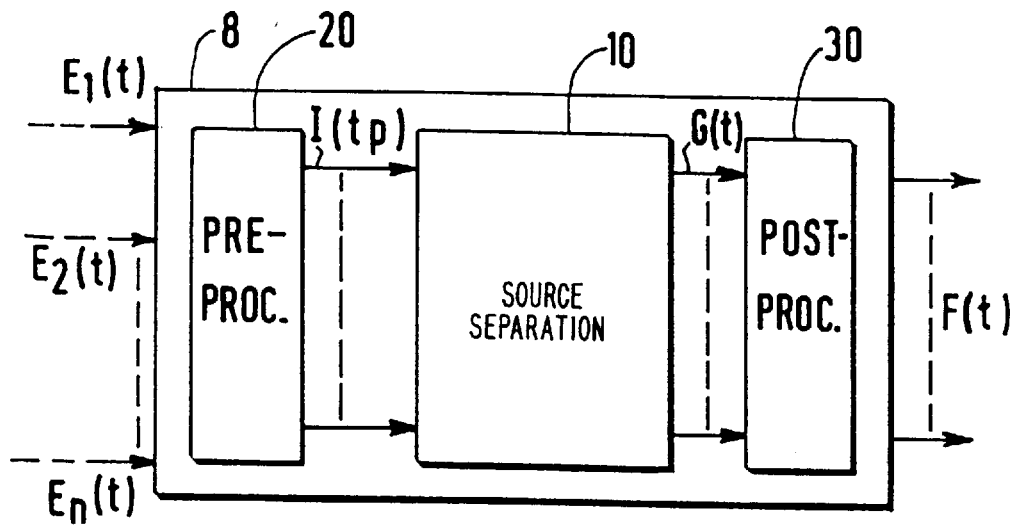
FIG. 5 is a block diagram of a source characterization system comprising pre-processing means and post-processing means.

To determine the spectral densities $D_X(V)$, it is also possible to combine the pre-processing means 20 described for the calculation of the autocorrelation functions, with a post-processing means 30 provided at the output of the source separation means 10. FIG. 5 relates to this type of processing. The pre-processing means 20 followed by the source separation means 10 determine the autocorrelation functions $\Gamma_{Xi}(t)$, the post-processing means 30 arranged at the output applying a Fourier transform.

The invention has been described for linearly convolutive signals containing gain terms and pure delay terms defined in equation (2).

The invention can also be applied to convolutive mixtures in general, i.e., those defined by equation (1).

Figure 6:
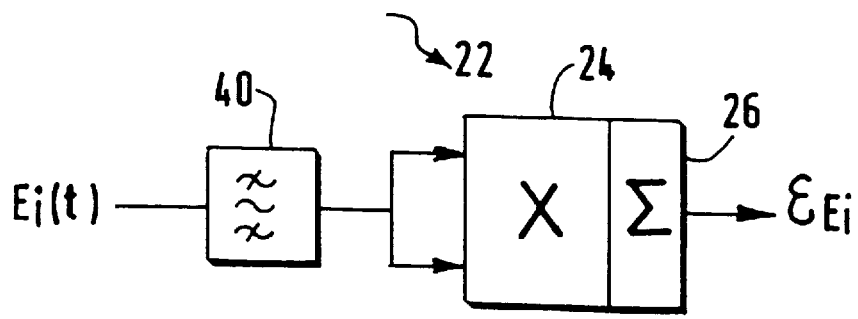
FIG. 6 is a diagram similar to that shown in FIG. 3 with filter means for processing general convolutive mixtures.

To reduce the general case to the specific case of equation (2) described above, the processing is applied to signals E(t) whose frequency band has first been limited. For this purpose the pre-processing means 20 comprises identical filters 40 (FIG. 6) at the input, these filters limiting each signal $E_i(t)$ to a smaller frequency band. Processing remains as described above but the results thus obtained now relate not only to the primary signals X(t), but also to filtered versions of their mixtures. Nevertheless, these results are adequate for source characterization even in the case of arbitrary convolutive mixtures. For example, when average energies or spectral densities are calculated, the signals relating to successive frequency bands may be combined at the output to obtain said characteristic variables for the entire frequency spectrum.

What is claim is:

1. A source characterization system for determining a characteristic variable of a source signal from a primary source on the basis of a plurality of input signals, the source characterization system comprising:

a plurality of inputs for receiving said plurality of input signals, respectively, each of said plurality of input signals being a different mixture of the source signal and a plurality of other source signals from other respective primary sources;

a pre-processing circuit coupled to said plurality of inputs for determining a characteristic variable of each of said plurality of input signals so as to form a plurality of characteristic variables for the plurality of input signals, respectively; and a separation circuit for determining the characteristic variable of the source signal on the basis of the plurality of characteristic variables determined for the plurality of input signals.

2. A source characterization system as claimed in claim 1, characterized in that the characteristic variable is: an average energy, a spectral density or an autocorrelation function.

3. A source characterization system as claimed in claim 1, wherein said plurality of characteristic variables for the plurality of input signals are formed by linear combinations, having fixed or slowly varying coefficients, of the characteristic variable, characterized in that said source characterization system further comprises a post-processing circuit arranged at an output of the separation circuit for post-processing signals supplied by the separation circuit, said linear combinations having fixed or slowly varying coefficients, being determined by combining the post-processing of said post-processing circuit and the pre-processing of said pre-processing circuit.

4. A source characterization system as claimed in claim 3, characterized in that the post-processing circuit supplies estimates of the source signal and said other source signals.

5. A source characterization system as claimed in claim 1, characterized in that said source characterization system further comprises control means having an input for receiving further signals from said separation circuit, said control means supplying at least one command for influencing at least one of said primary source and said other respective primary sources.

6. An application of the source characterization system as claimed in claim 1, for controlling apparatuses for transmitting electric, acoustic or electromagnetic signals.

7. An application of the source characterization system as claimed in claim 6, for controlling sound produced by a car radio, or for controlling an operation of a hands-free telephone.

8. An application of the source characterization system as claimed in claim 1, for controlling apparatuses for receiving electric, acoustic or electromagnetic signals.

9. An application of the source characterization system as claimed in claim 8, for controlling sound produced by a car radio, or for controlling an operation of a hands-free telephone.

10. An application of the source characterization system as claimed in claim 1, for controlling apparatuses for transmitting and receiving electric, acoustic or electromagnetic signals.

11. An application of the source characterization system as claimed in claim 10, for controlling sound produced by a car radio, or for controlling an operation of a hands-free telephone.

* * * * *